(12) United States Patent
You et al.

(10) Patent No.: US 11,469,375 B2
(45) Date of Patent: Oct. 11, 2022

(54) DISPLAY DEVICE WITH A CONDUCTOR PATTERN TRANSFERRED BY LASER IRRADIATION AND A MANUFACTURING METHOD THEREOF

(71) Applicant: SAMSUNG DISPLAY CO., LTD., Yongin-si (KR)

(72) Inventors: Jun Woo You, Seongnam-si (KR); Dong Hyeon Lee, Seoul (KR); Yong Kyu Kang, Hwaseong-si (KR); Tae Ho Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 238 days.

(21) Appl. No.: 16/804,632

(22) Filed: Feb. 28, 2020

(65) Prior Publication Data
US 2020/0313092 A1    Oct. 1, 2020

(30) Foreign Application Priority Data
Mar. 25, 2019    (KR) ........................ 10-2019-0033686

(51) Int. Cl.
*H01L 51/00* (2006.01)
*H01L 27/32* (2006.01)

(52) U.S. Cl.
CPC ...... *H01L 51/0021* (2013.01); *H01L 27/3276* (2013.01)

(58) Field of Classification Search
CPC ........................ H01L 51/0021; H01L 27/3276
See application file for complete search history.

(56) References Cited

U.S. PATENT DOCUMENTS 7,674,749 B2 * 3/2010 Kang ........................ B41M 5/46
                                                                  503/227
8,575,649 B2 * 11/2013 Park ........................ C23C 14/048
                                                                  257/179

(Continued)

FOREIGN PATENT DOCUMENTS

JP          2014-032817        2/2014
KR    10-2013-0047971        5/2013

(Continued)

OTHER PUBLICATIONS

Kun-Tso Chen et al., "Patterning of metal electrode on flexible substrate using laser transfer method", Department of Mechanical Engineering, National Chung Cheng University, Laser Application Technology Center, Industrial Technology Research Institute South, Display Technology Center, Industrial Technology Research Institute, 2010, 2 pages.

(Continued)

*Primary Examiner* — Lex H Malsawma
(74) *Attorney, Agent, or Firm* — F. Chau & Associates, LLC

(57) ABSTRACT

A manufacturing method of a display device includes: stacking a release layer over a first substrate; forming a conductor pattern over the release layer; forming a sacrificial layer over the conductor pattern; forming a second substrate including a polymer layer over the sacrificial layer; forming an electronic element including a conductor over the second substrate; forming a pattern corresponding to the conductor pattern in the sacrificial layer; transferring the conductor pattern from the release layer to a surface of the second substrate; and removing the first substrate, the release layer, and the sacrificial layer.

18 Claims, 24 Drawing Sheets

(56) References Cited

U.S. PATENT DOCUMENTS

| | | | |
|---|---|---|---|
| 8,877,559 B2 | 11/2014 | Gao et al. | |
| 2005/0017268 A1* | 1/2005 | Tsukamoto | H01L 27/3251 257/200 |
| 2007/0257276 A1* | 11/2007 | Kwon | H01L 51/0013 257/192 |
| 2010/0003781 A1 | 1/2010 | Van Duren et al. | |
| 2010/0055343 A1* | 3/2010 | Lee | H01L 51/0013 427/554 |
| 2011/0084286 A1* | 4/2011 | Park | C23C 14/048 257/79 |
| 2014/0225074 A1 | 8/2014 | Kim et al. | |
| 2018/0211596 A1 | 7/2018 | Gu | |
| 2018/0269234 A1* | 9/2018 | Hughes | H01L 27/1248 |

FOREIGN PATENT DOCUMENTS

| | | |
|---|---|---|
| KR | 10-2017-0133573 | 12/2017 |
| KR | 10-2018-0076429 | 7/2018 |

OTHER PUBLICATIONS

European Search Report dated Jul. 22, 2020, issued in corresponding European Patent Application No. 20164187.5.
Ravati et al., "3D Porous Polymeric Conductive Material Prepared Using LbL Deposition", Polymer 52, 2011, pp. 718-731.
European Search Report dated Nov. 13, 2020, issued in corresponding European Patent Application No. 20164187.5.

\* cited by examiner

DISPLAY DEVICE WITH A CONDUCTOR PATTERN TRANSFERRED BY LASER IRRADIATION AND A MANUFACTURING METHOD THEREOF

CROSS-REFERENCE TO RELATED APPLICATION

This application claims priority under 35 U.S.C. § 119 to Korean Patent Application No. 10-2019-0033686 filed in the Korean Intellectual Property Office on Mar. 25, 2019, the disclosure of which is incorporated by reference herein in its entirety.

(a) Technical Field

This disclosure relates to a display device and a manufacturing method thereof.

(b) Description of the Related Art

A display device such as an organic light emitting diode display includes a display panel. The display panel may be manufactured by forming pixels and circuit elements for driving the pixels on a substrate.

The display panel may include a display area on which images are displayed, and a non-display area in which a driving circuit, a signal line, and the like are disposed. The display area may form a screen of the display panel. The non-display area may be located at an edge of the display panel. A pad portion in which pads for inputting/outputting signals are disposed may be formed in the non-display area of the display panel, and a flexible circuit film may be bonded to the pad portion.

A demand for electronic devices (e.g., smart phones, tablet personal computers, laptops, televisions, monitors, etc.) with a large screen-to-body ratio is increasing. The size of the non-display area of the display panel can prevent the screen-to body ratio of the electronic device from increasing. Accordingly, the non-display area is being reduced in size. However, to reduce the non-display area, elements disposed in the non-display area may be compactly designed or omitted, thereby reducing reliability of the display device.

A high-resolution display device is also in demand. To produce a high resolution display device, the number of signals transmitted to the display panel increase, and the number of pads increase. To increase the number of pads in a limited pad area, a pad pitch is reduced; however, this may have constraints such as tolerance limit and bonding reliability. In addition, since more wires end up being disposed in the display area and/or the non-display area, wire resistance increases, thereby leading to a decrease in display quality and increase in power consumption.

SUMMARY

A manufacturing method of a display device according to one or more embodiments includes: stacking a release layer over a first substrate; forming a conductor pattern over the release layer, forming a sacrificial layer over the conductor pattern, forming a second substrate including a polymer layer over the sacrificial layer, forming an electronic element including a conductor over the second substrate, forming a pattern corresponding to the conductor pattern in the sacrificial layer, transferring the conductor pattern from the release layer to a surface of the second substrate, and removing the first substrate, the release layer, and the sacrificial layer.

The release layer may be a dynamic release layer.

The pattern in the sacrificial layer may be an engraved pattern, and the forming of the pattern in the sacrificial layer may include irradiating the conductor pattern with a laser to remove a portion of the sacrificial layer overlapping the conductor pattern.

The removing of the portion of the sacrificial layer overlapping the conductor pattern may include vaporizing the portion of the sacrificial layer overlapping the conductor pattern.

The transferring of the conductor pattern to the surface of the second substrate may include irradiating the conductor pattern with a laser to melt the conductor pattern, and interfusing the melted conductor pattern into the pattern in the sacrificial layer.

The manufacturing method of the display device may further include forming an overcoat layer covering the conductor pattern after forming the conductor pattern and before forming the sacrificial layer.

The manufacturing method of the display device may further include electrically connecting the conductor pattern and the conductor.

The removing of the first substrate, the release layer, and the sacrificial layer may include removing the sacrificial layer after simultaneously separating the first substrate and the release layer from the sacrificial layer.

The electronic element may further include a transistor and a light emitting element.

The conductor may include a power supply line or a data line.

The conductor pattern may include a pad, a power supply line, or a data line.

The sacrificial layer may include a porous polymer.

The pattern in the sacrificial layer may be a porous pattern, and the forming of the pattern in the sacrificial layer may include irradiating the conductor pattern with a laser to increase porosity of a portion of the sacrificial layer corresponding to the conductor pattern.

The transferring the conductor pattern from the release layer to the surface of the second substrate may include interfusing the conductor pattern to the pattern in the sacrificial layer.

The surface of the second substrate to which the conductor pattern is transferred may be a rear surface of the second substrate.

A display device according to one or more embodiments includes: a substrate; an electronic element disposed over the substrate and including a conductor; a conductor pattern located below the substrate; and a connector that penetrates through the substrate and electrically connects the conductor and the conductor pattern, wherein the conductor pattern may include a pad, a power supply line, or a data line.

The conductor pattern may be disposed over a rear surface of the substrate.

The substrate may be a polymer layer having a thickness of less than 100 micrometers.

The conductor pattern may include a conductive material and a polymer.

The conductor pattern may include a porous polymer and a conductive material filled in the porous polymer.

The electronic element may include a circuit element and a light emitting element, the circuit element may include the conductor, and the conductor may include a power supply line or a data line.

The substrate may include a display area over which an image is displayed and a non-display area adjacent to the display area, and the conductor pattern may include a portion overlapping the display area.

A method of manufacturing a display device according to one or more embodiments includes: stacking a release layer over a first substrate; forming a conductor pattern over the release layer; forming a sacrificial layer over the conductor pattern; forming a second substrate over the sacrificial layer; forming a conductor over the second substrate; irradiating a laser to the conductor pattern to remove a portion of the sacrificial layer overlapping the conductor pattern and transfer the conductor pattern to the second substrate in a space formed in the sacrificial layer; and removing the first substrate, the release layer and the sacrificial layer.

The sacrificial layer may include a porous polymer.

The laser may be irradiated from a first surface of the first substrate to the conductor pattern which is disposed at a second surface of the first substrate opposite the first surface.

DETAILED DESCRIPTION OF THE EMBODIMENTS

Figure 1:
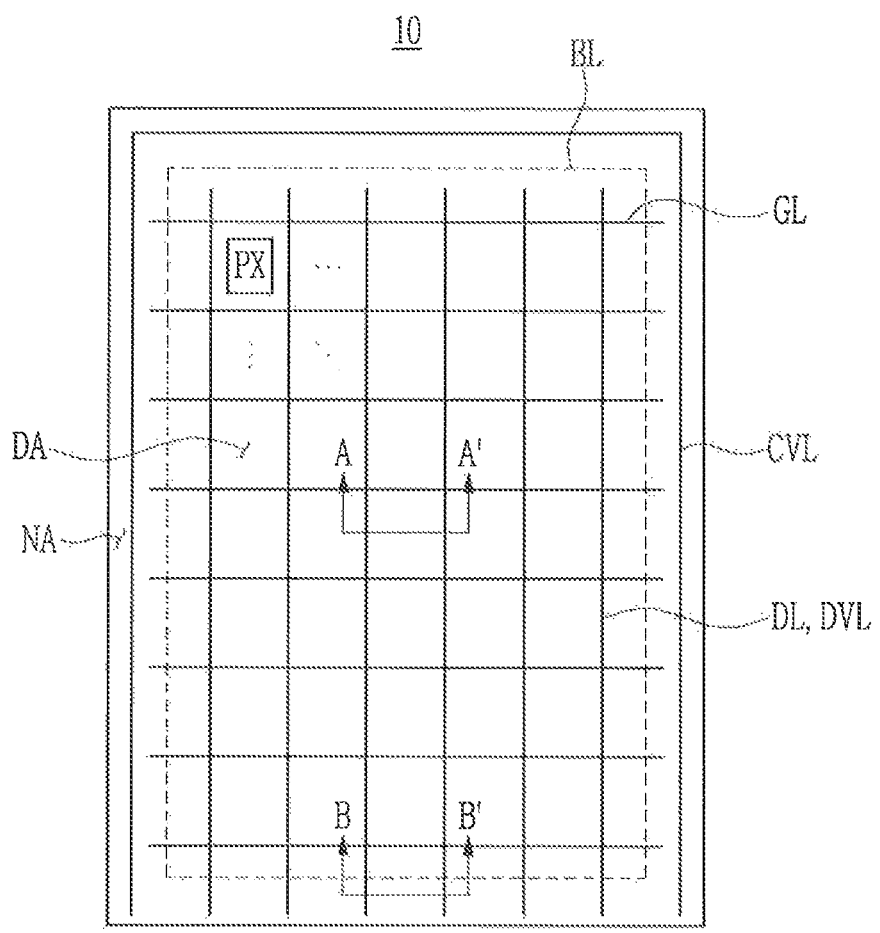
FIG. 1 illustrates a schematic front view of a display device according to an exemplary embodiment of the present invention.

Hereinafter, exemplary embodiments of the present invention will be described more fully with reference to the accompanying drawings. As those skilled in the art would realize, the described embodiments may be modified in various different ways, and thus, should not be limited to the embodiments set forth herein.

Like reference numerals may designate like elements throughout the specification.

In the drawings, the thicknesses of layers, films, panels, regions, etc., may be exaggerated for clarity.

It will be understood that when an element such as a layer, film, region, or substrate is referred to as being "on" another element, it may be directly on the other element or one or more intervening elements may also be present.

Spatially relative terms, such as "beneath," "below," "under," "lower," "above," "upper," "over," "higher," "side", and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. Throughout the specification, the phrase "on a plane" may mean viewing a target portion from the top, and the phrase "on a cross-section" may mean viewing a cross-section formed by vertically cutting a target portion from the side.

As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

In the drawings, as symbols used for indicating directions, 'x' is a first direction, 'y' is a second direction perpendicular to the first direction, and z is a third direction perpendicular to the first direction and the second direction. The first direction (x), the second direction (y), and the third direction (z) may correspond to a horizontal direction, a vertical direction, and a thickness direction of the display device, respectively.

A display device according to an exemplary embodiment of the present invention will now be described in detail with reference to the accompanying drawings.

Figure 2:
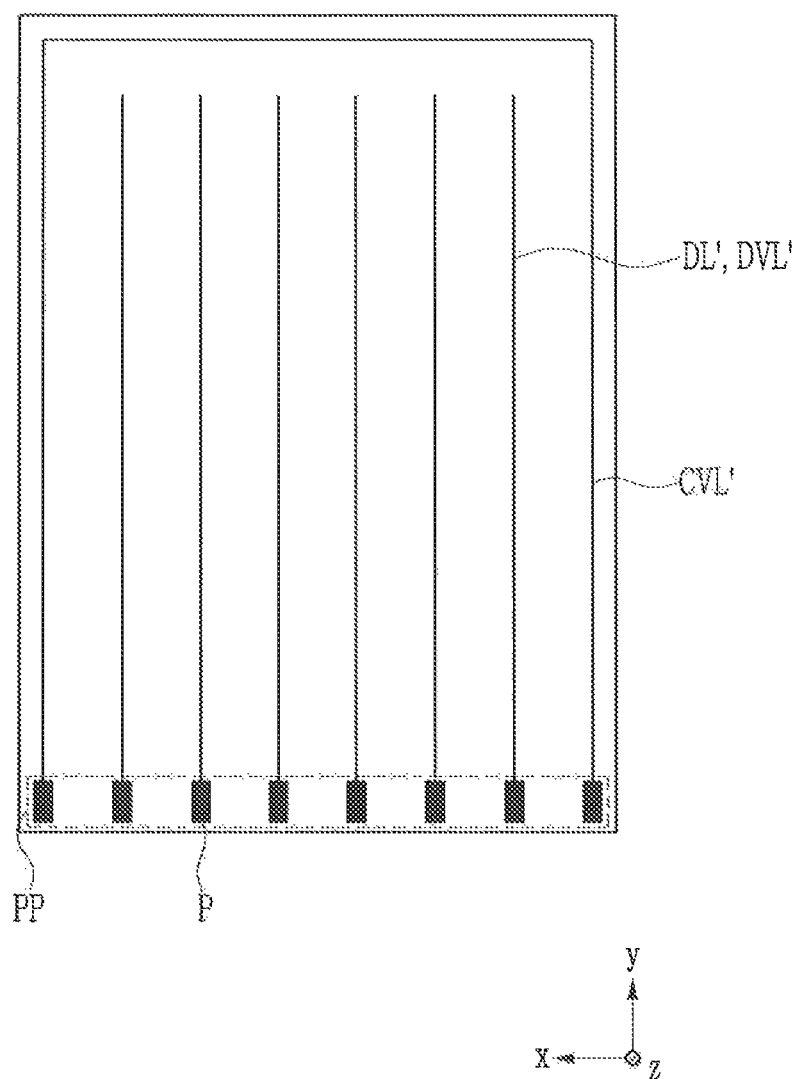
FIG. 2 illustrates a schematic rear view of the display device shown in FIG. 1.

FIG. 1 illustrates a schematic front view of a display device according to an exemplary embodiment of the present invention, and FIG. 2 illustrates a schematic rear view of the display device shown in FIG. 1. Here, the front surface of the display device is one surface of a substrate of a display panel 10, and the rear surface of the display device is another surface of the substrate of the display panel 10.

Referring to FIG. 1, the display device includes the display panel 10, and the display panel 10 includes a display area DA, which is an inner area of a boundary line BL indicated by a dotted line, and a non-display area NA, which is an outer area of the boundary line BL. In the display panel 10, the display area DA corresponds to a screen on which an image is displayed. The display area DA is also referred to as an active area. Circuits and/or signal lines for generating and/or transmitting various signals to be applied to the display area DA are disposed in the non-display area NA around the display area DA. The non-display area NA may surround the display area DA.

In the display area DA of the display panel 10, for example, pixels PX are arranged in a matrix. When the display device is an organic light emitting diode display, signal lines such as gate lines GL, data lines DL, and driving voltage lines DVL are also disposed in the display area DA. The gate lines GL, the data lines DL, and the driving voltage lines DVL extend to the non-display area NA. In other words, the gate lines CL, the data lines DL, and the driving voltage lines DVL may be provided in the non-display area NA. In the display area DA, the gate lines GL may extend in a first direction x, and the data lines DL and the driving voltage lines DVL may extend in a second direction y. A common voltage line CVL for transmitting a common voltage may be disposed in the non-display area DA.

The gate line GL, the data line DL, and the driving voltage line DVL are connected to each pixel PX. Each pixel PX may receive a gate signal, a data signal, and a driving voltage from the gate line CL, the data line DL, and the driving voltage line DVL connected thereto. Each pixel PX may include a light emitting element, which may be an organic light emitting diode. Signal lines such as a sensing line or an emission control line that may be connected to the pixel PX or a signal line for transmitting a different signal from the above-mentioned signals may also be disposed in the display area DA. A touch sensor layer for sensing a contact touch or a non-contact touch of a user may be disposed in the display area DA.

Referring to FIG. 2, a pad portion PP including pads P for receiving signals from outside the display panel 10 is disposed on the rear surface of the display panel 10. The display device may include a flexible printed circuit film that is bonded to the pad portion PP. The pads of the flexible circuit film may be electrically connected to the pads P of the pad portion PP through an anisotropic conductive film or the like.

In general, the pad portion PP is disposed in the non-display area NA at the front surface of the display panel 10. Since the pad portion PP requires a predetermined area for bonding to the flexible printed circuit film, the pad portion PP causes as increase in the size of the non-display area NA. By forming the pad portion PP on the rear surface of the display panel 10 as in the present embodiment, the size of the non-display area NA can be reduced, and thus, the screen-to-body ratio of the display device can be increased. The pads P of the pad portion PP may be electrically connected to signal lines such as the data line DL, the driving voltage line DVL, and the common voltage line CVL, which are disposed on the front surface of the display panel 10, by connectors formed through the substrate. The connectors may be formed of a conductive material such as a metal or a metal alloy.

The pad portion PP may extend along the vicinity of one edge in the rear surface of the display panel 10. For example, the pad portion PP may extend in the first direction x. When the display panel 10 is a front emission type of light emitting display panel, no image is displayed on the rear surface of the display panel 10. Therefore, the entire rear surface of the display panel 10 may be a non-display area, and the pad portion PP may be disposed anywhere on the rear surface of the display panel 10. In addition, the pad portion PP may overlap the display area DA of the front surface of the display panel 10. Therefore, even if the number of the pads P increases according to a high resolution, a design margin for arranging the pads P may increase. Therefore, a size and pitch of the pads P of the pad portion PP may be more freely designed, and the reliability of bonding with the flexible printed circuit film may be increased.

A power supply line such as a driving voltage line DVL' and a common voltage line CVL' may be positioned on the rear surface of the display panel 10. Data lines DL' may also be positioned on the rear surface of the display panel 10. The driving voltage line DVL', the common voltage line CVL', and the data line DL' may be respectively connected to the driving voltage line DVL, the common voltage line CVL, and the data line DL disposed on the front surface of the display panel 10, by a connector formed through the substrate. As such, the signal lines (DVL', CVL', DL') are formed on the rear surface of the display panel 10, and they are electrically connected to the signal lines (DVL, CVL, DL) formed on the front surface of the display panel 10, thereby reducing a resistance of the signal lines and a load effect. Therefore, display quality such as luminance uniformity of the display area DA, red, green, and blue (RGB) color crosstalk, and the like may be increased.

Hereinafter, the pad P, the driving voltage line DVL', the common voltage line CVL', the data line DL', and the like formed on the rear surface of the display panel 10 are referred to as a conductor pattern, and the data line DL, the driving voltage line DSL, the common voltage line CVL, and the like, which are disposed on the front surface of the display panel 10 and electrically connected to the conductor pattern through the connectors, are referred to as a conductor.

The display device includes a driving unit. The driving unit may generate and/or process various signals for driving the display panel 10. The driving unit may include a data driver for applying a data signal to the data lines DL, a gate driver for applying a gate signal to the gate lines GL, and a signal controller for controlling the data driver and the gate driver. The gate driver, the data driver, and the signal controller may be located in the non-display area NA of the display panel 10. In addition, the gate driver, the data driver, and/or the signal controller may be located on the flexible printed circuit film, or the printed circuit board electrically connected to the flexible printed circuit film. For example, the gate driver may be integrated in the non-display area NA of the display panel 10, and the data driver and the signal controller may be mounted on the flexible printed circuit film as a type of integrated circuit chip.

Figure 3:
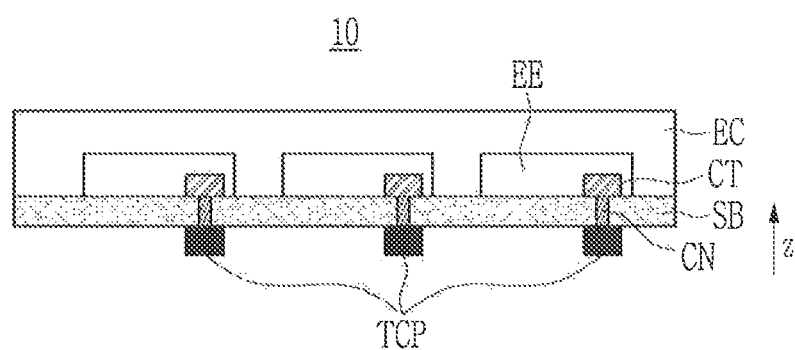
FIG. 3 illustrates a schematic cross-sectional view of a display device according to exemplary embodiment of the present invention.

FIG. 3 illustrates a schematic cross-sectional view of a display device according to an exemplary embodiment of the present invention.

FIG. 3 schematically illustrates a cross-sectional structure for explaining a positional relationship in a sectional view of the constituent elements in the display device as shown in FIG. 1 and FIG. 2. Thus, FIG. 3 illustrates the constituent elements in a different manner from that shown in FIG. 1 and FIG. 2. Therefore, planar positions of the constituent elements do not necessarily correspond to those shown in FIG. 1 and FIG. 2.

Referring to FIG. 3, the display panel 10 includes a substrate SB, electronic elements EE disposed on the substrate SB, and a transferred conductor pattern TCP disposed below the substrate SB. The substrate SB may be a polymer layer having a thickness of less than about 100 micrometers. An upper side of the substrate SB on which the electronic elements EE are disposed corresponds to the front side of the display panel 10 or the substrate SB, in other words, an area in which the screen exists. A lower side of the substrate SB on which the transferred conductor pattern TCP is disposed corresponds to the rear surface of the display panel 10 or the substrate SB.

The electronic elements EE include the pixels PX of the display panel 10 and electrical and/or electronic elements formed or arranged on the substrate SB for driving the pixels PX. The electronic elements EE include circuit elements such as transistors, capacitors, and signal lines. When the display panel 10 is an organic light emitting display panel, the electronic elements EE include light emitting elements such as organic light emitting diodes. The circuit elements of the electronic elements EE may be formed by forming and patterning conductive layers on the substrate SB, and insulating layers may be formed between the conductive layers for insulation between the conductive layers. The circuit elements of the electronic elements EE include a conductor CT that is electrically connected to the transferred conductor pattern TCP through a connector CN. The conductor CT may include the data line DL, the driving voltage line DVL, and/or the common voltage line CVL, as described above. In addition, the conductor CT may have a configuration in which the electronic elements EE are included and through which an electrical signal may be transmitted. For example, the conductor CT may be one electrode of a transistor.

The display panel 10 may include an encapsulating layer EC for sealing the electronic elements EE. The encapsulating layer EC seals the display area DA to prevent water or oxygen from permeating into the display panel 10, particularly, the display area DA.

The transferred conductor pattern TCP disposed on the rear surface of the substrate SB below the substrate SB may include at least one of the pad P, the driving voltage line DVL', the common voltage line CVL', and the data line DL', which are described above. The transferred conductor pattern TCP is not formed on the rear surface of the substrate SB from the beginning, but is transferred to the rear surface of the substrate SB after being formed on a transfer paper. The transferred conductor pattern TCP may be formed by using laser transfer technologies. The transferred conductor pattern TCP may be formed of various conductive materials such as a metal, a metal alloy, a transparent conductive oxide, and a conductive polymer. For example, the transferred conductor pattern TCP may be formed of copper, a copper alloy, aluminum, an aluminum alloy, or the like.

Since the electronic elements EE of the display panel 10 are formed on the substrate SB, in order to transmit a signal or voltage inputted to the transferred conductor pattern TCP to the electronic elements EE, the connector CN for electrically connecting the conductor pattern TCP and the conductor CT is disposed in the substrate SB. In other words, the connector CN is disposed in a hole of the substrate SB, and one end thereof and the other end thereof are connected to the transferred conductor pattern TCP and the conductor CT, respectively. The hole of the substrate SB and the connector CN may be formed in a direction z that is substantially perpendicular to a flat surface of the substrate SB.

The structural features of the display device according to exemplary embodiments of the present invention have been described so far. Now, a method of manufacturing the display device as shown in FIG. 3 will be described.

FIG. 4 to FIG. 15 illustrate cross-sectional views of a manufacturing process of the display device shown in FIG. 3.

Figure 4:
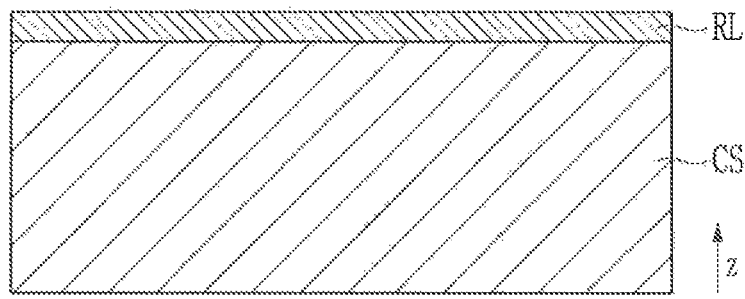
FIGS. 4, 5, 6, 7, 8, 9, 10, 11, 12, 13, 14 and 15 illustrate cross-sectional views of a manufacturing process of the display device shown in FIG. 3.

Referring to FIG. 4, a release layer RL such as a dynamic release layer is stacked on a carrier substrate CS. The release layer RL may be formed by coating the carrier substrate CS with a material such as an ultraviolet (UV)-degradable photopolymer, and may be attached to the carrier substrate CS by an adhesive. As the UV-degradable photopolymer, a triazene polymer may be used. The release layer RL may function as a light-to-heat conversion layer.

As the carrier substrate CS, a transparent substrate such as a glass substrate may be used. The carrier substrate CS may have a characteristic that a laser may be transmitted therethrough so that laser energy may be transmitted through the carrier substrate CS.

Figure 5:
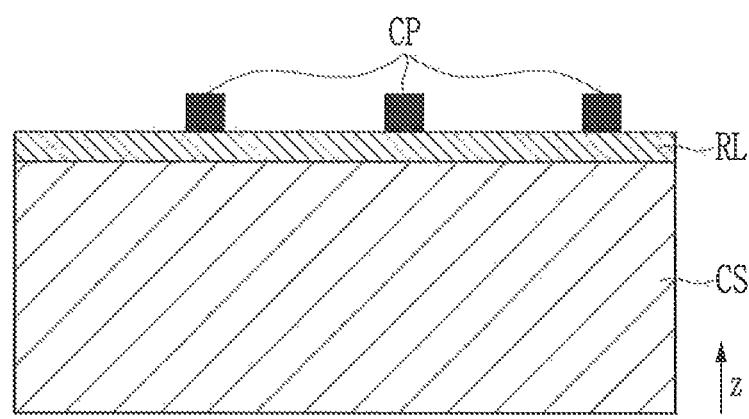

Referring to FIG. 5, by forming and patterning a conductive layer on the release layer RL, a conductor pattern CP is formed. The conductive layer may be formed by various methods such as sputtering, vapor deposition, and coating, depending on a material. The patterning may be performed by a photolithography process.

Figure 6:
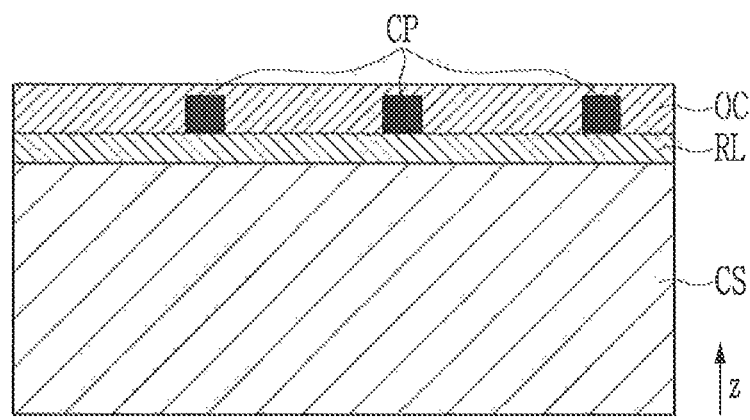

Referring to FIG. 6, an overcoat layer OC is formed on the release layer RL on which the conductor pattern CP is formed. The overcoat layer OC planarizes an uneven surface due to the conductor pattern CP. The overcoat layer OC may be omitted.

Figure 7:
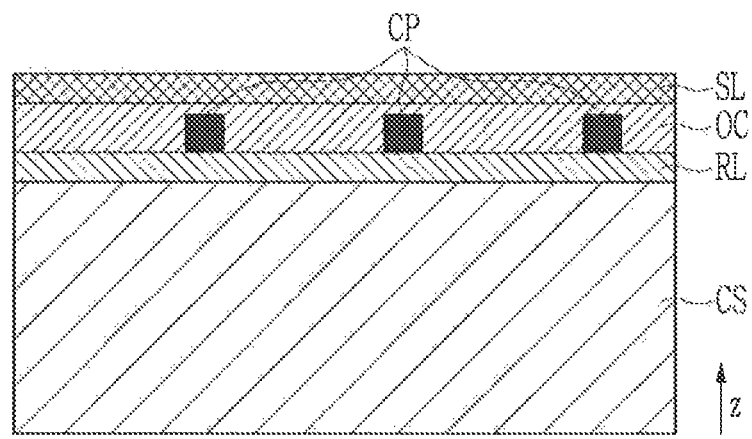

Referring to FIG. 7, a sacrificial layer SL is formed on the overcoat layer OC. As the sacrificial layer SL, a porous polymer may be used. The porous polymer may be formed by coating a hydrophobic polymer solution in a humid condition and evaporating water droplets in the hydrophobic polymer solution. Pores of the porous polymer may be controlled by controlling humidity, temperature, a moving speed, etc., and a pore size may be from about 100 nanometers to tens of micrometers.

Figure 8:
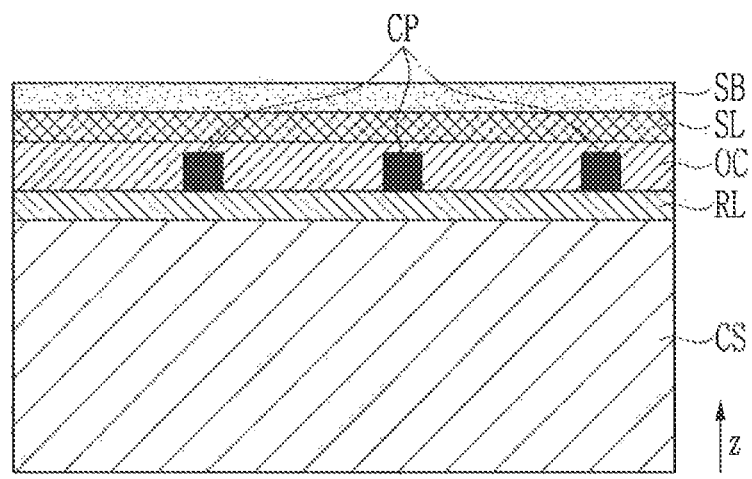

Referring to FIG. 8, the substrate SB is stacked on the sacrificial layer SL. The substrate SB may be a flexible substrate formed by coating a polymer such as a polyimide (PI), a polyamide (PA), or polyethylene terephthalate (PET) on the sacrificial layer SL. The substrate SB may have a thin thickness, such as less than about 100 micrometers, less than about 50 micrometers, less than about 30 micrometers, or less than about 15 micrometers.

Figure 9:
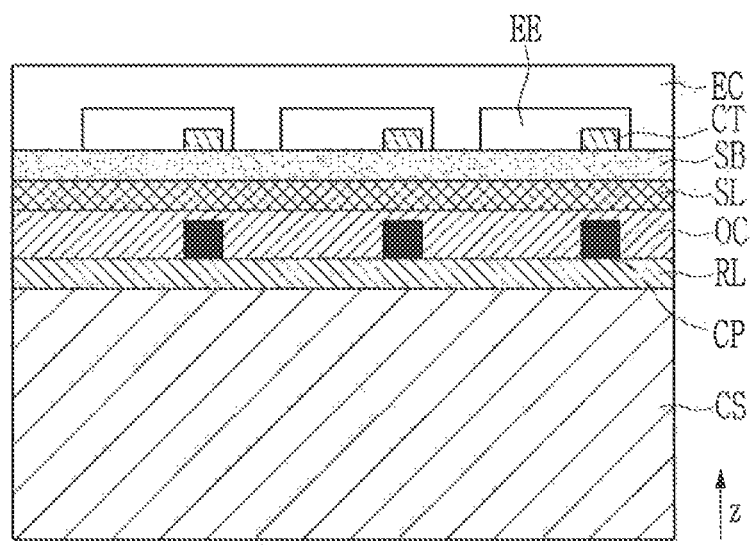

Referring to FIG. 9, the electronic element EE is formed on the substrate SB. The forming of the electronic element EE may include forming the conductor CT such as a signal line, a transistor, and a capacitor on the substrate SB, and forming a light emitting element (for example, an organic light emitting diode or a light emitting diode) connected to the signal line, the transistor, and/or the capacitor. The encapsulating layer EC may be formed on the electronic element EE to cover and seal the electronic element EE.

Figure 10:
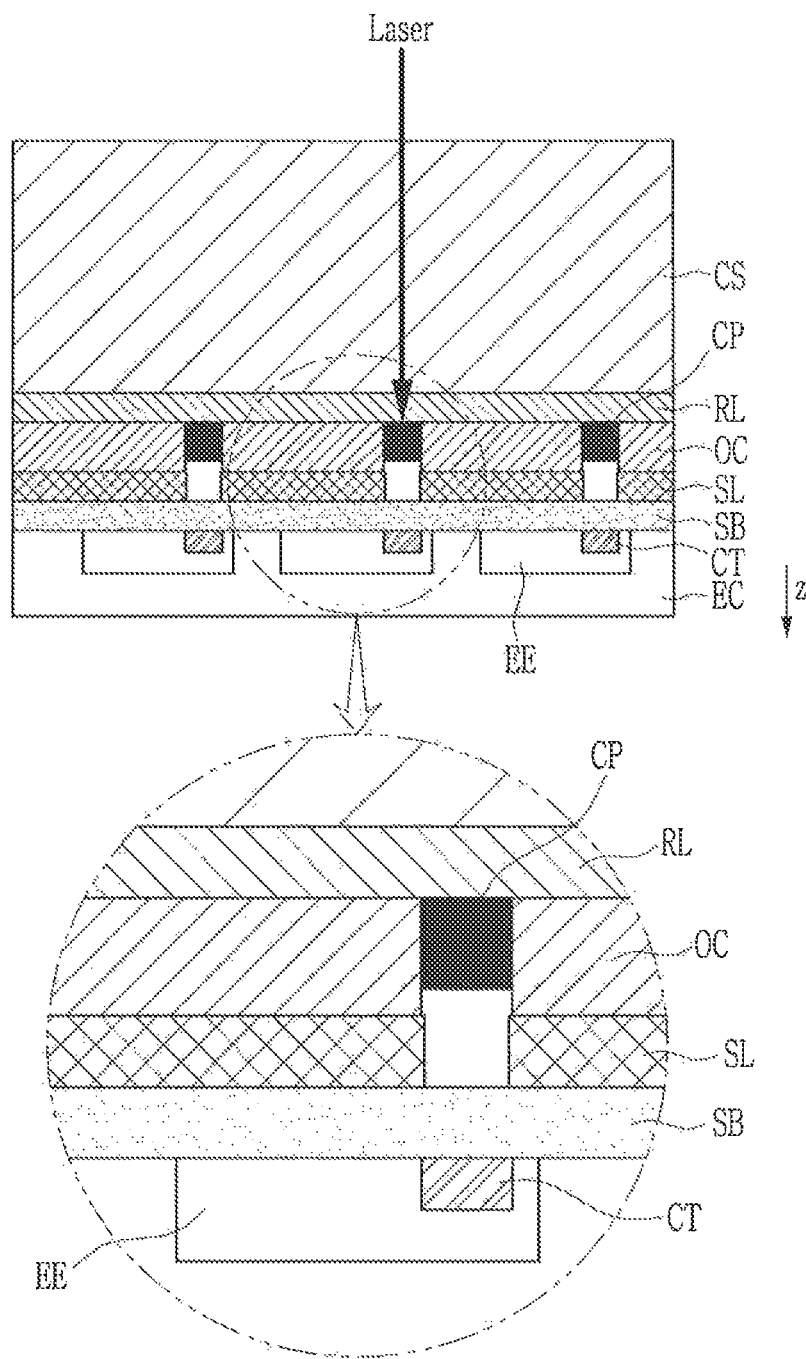

Referring to FIG. 10, a laser is irradiated to the conductor pattern CP from a rear surface of the carrier substrate CS to remove a portion overlapping the conductor pattern CP in the overcoat layer CC and the sacrificial layer SL. In other words, portions of the overcoat layer OC and the sacrificial layer SL are to be removed by the laser. The laser may be focused on the conductor pattern CP. The portions of the overcoat layer OC and the sacrificial layer SL overlapping the conductor pattern CP may be vaporized and removed by heat of the conductor pattern CP heated by the laser energy. Since the sacrificial layer SL is porous, the vaporized material may escape through the pores of the sacrificial layer SL. By such laser irradiation, an engraved pattern corresponding to the conductor pattern CP may be formed in the sacrificial layer SL. The engraved pattern formed in the sacrificial layer SL is formed by removing a portion of the sacrificial layer SL corresponding to the conductor pattern CP in the sacrificial layer SL. The engraved pattern in the sacrificial layer SL may be formed through the sacrificial layer SL. In other words, the engraved pattern may pass from one side of the sacrificial layer SL to another side of the sacrificial layer SL. For example, the engraved pattern may be an opening or a space formed in the sacrificial layer SL. Therefore, a portion of the substrate SB corresponding to the conductor pattern CP may not be covered with the sacrificial layer SL.

Figure 11:
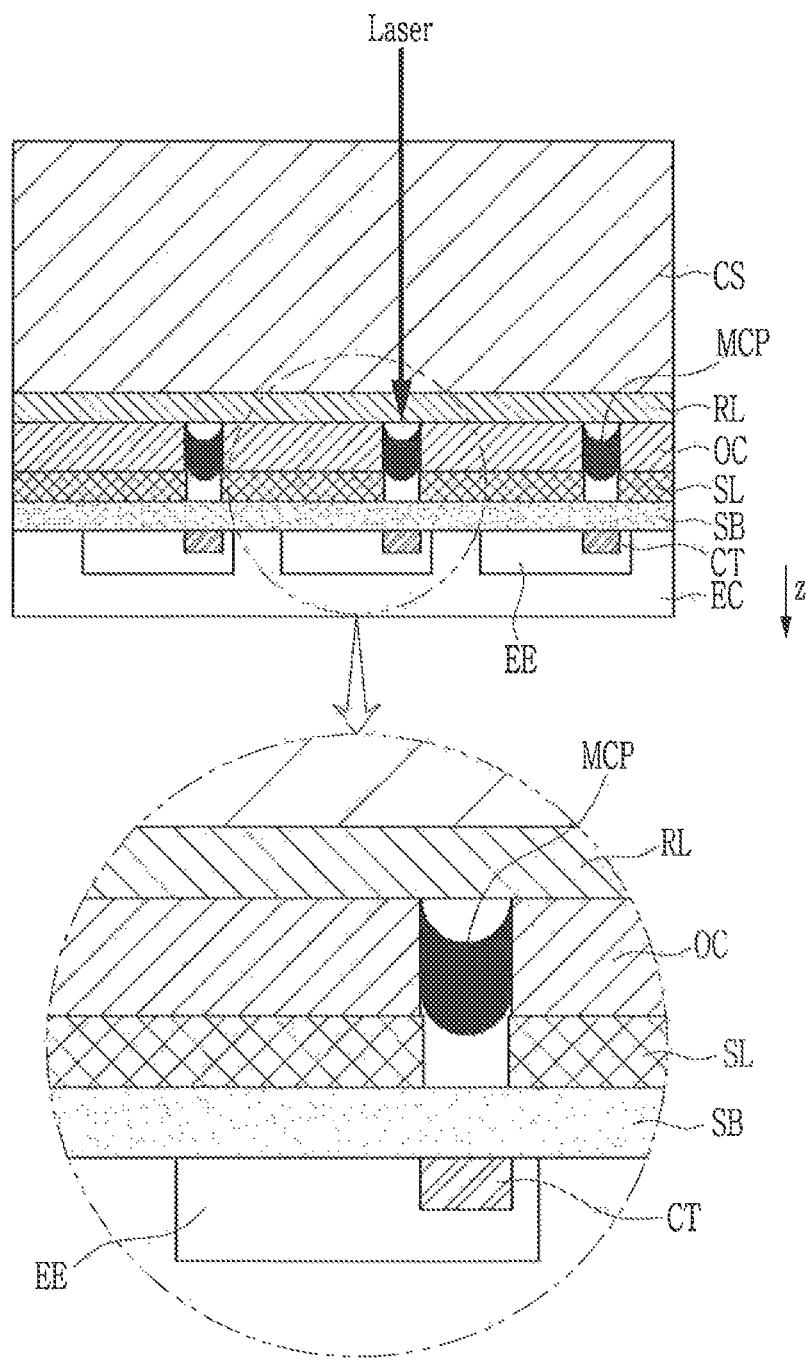
Figure 12:
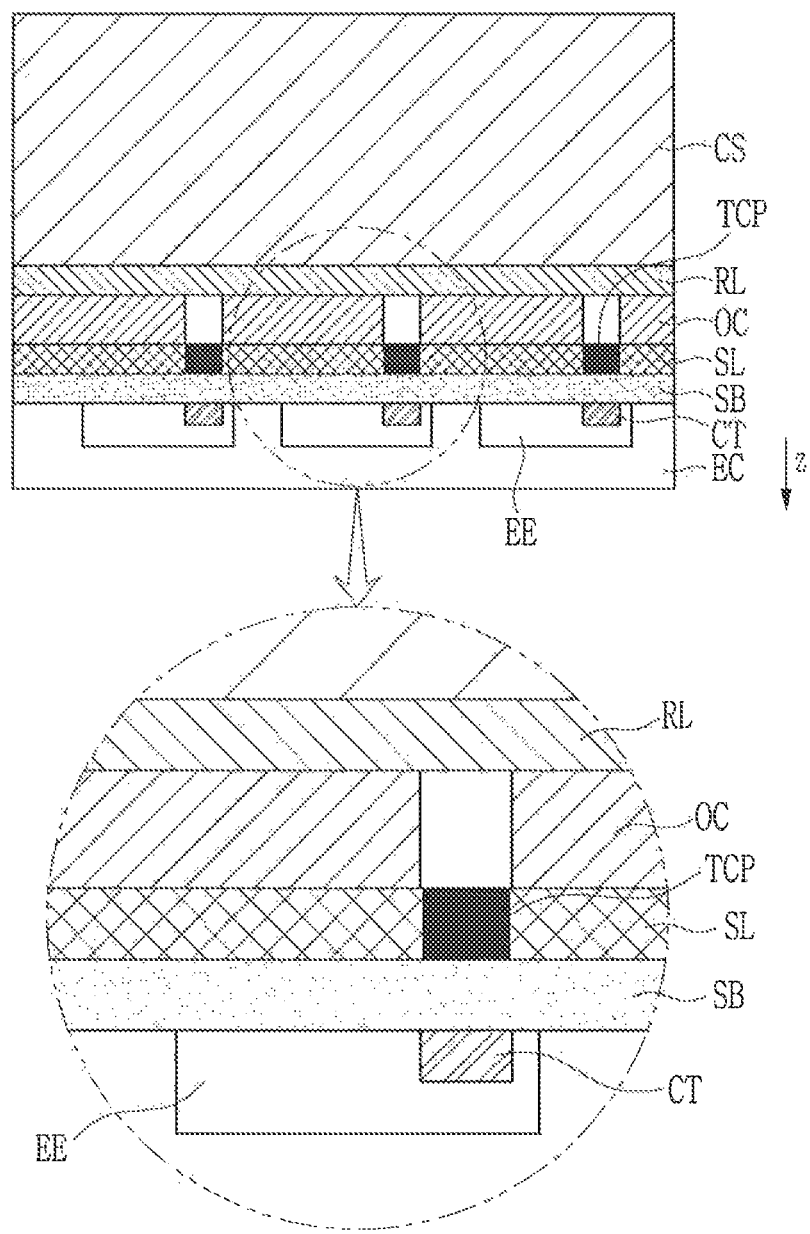

Referring to FIG. 11, a laser is irradiated onto the conductor pattern CP from the rear surface of the carrier substrate CS to interfuse the conductor pattern CP into the engraved pattern in the sacrificial layer SL. The laser may be focused on the conductor pattern CP. The conductor pattern CP may be melted by the laser energy. In addition, a blister may be generated at the interface between the release layer RL and the carrier substrate CS due to local heating in a region overlapping the conductor pattern CP. The release layer RL may be a light-to-heat conversion layer that receives light (e.g., the laser) and generates heat, and the blister may expand due to the generated heat. When the blister expands, the release layer RL pushes the melted conductor pattern MCP in the third direction z, and thus, the melted conductor pattern MCP may be accurately interfused into the engraved pattern in the sacrificial layer SL. Thus, the conductor pattern CP formed on the release layer RL is transferred to the rear surface of the substrate SB as shown in FIG. 12 to form the transferred conductor pattern TCP.

Figure 13:
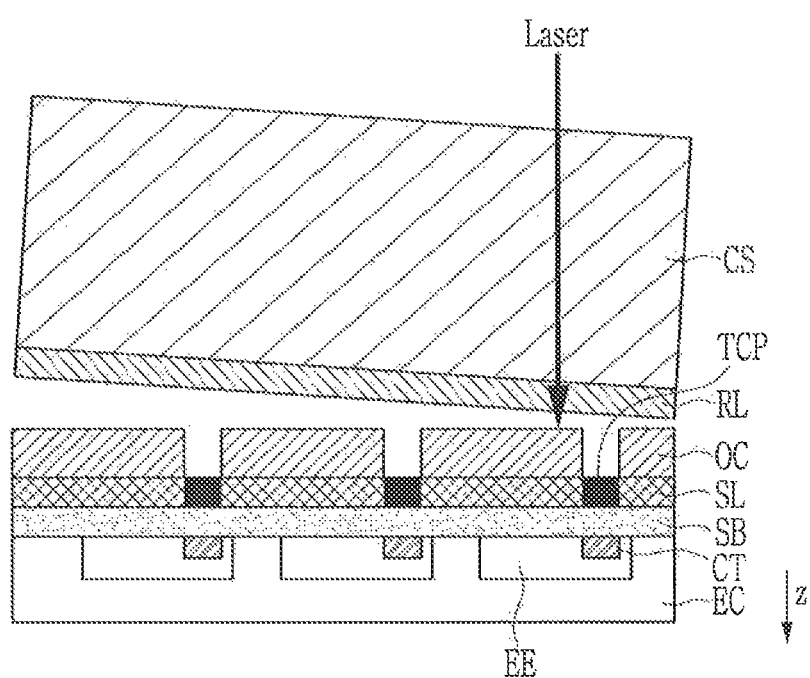
Figure 14:
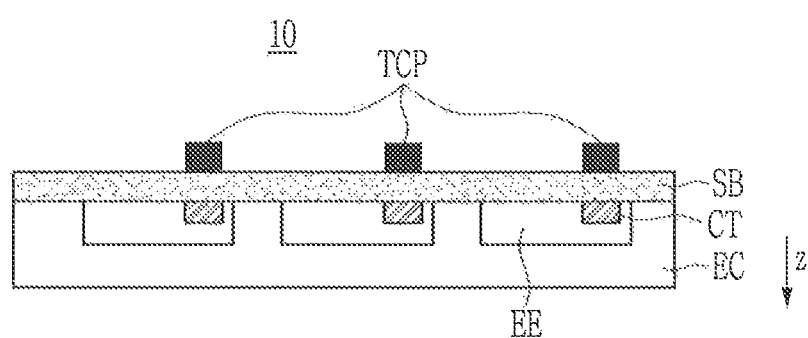

Thereafter, referring to FIG. 13, the release layer RL is separated from the overcoat layer OC together with the carrier substrate CS by a laser lift-off method. Then, referring to FIG. 14, the overcoat layer OC and the sacrificial layer SL remaining on the rear surface of the substrate SB are removed. The overcoat layer OC and the sacrificial layer SL may be separated from the substrate SB together by a laser lift-off method of irradiating a laser between the substrate SB and the sacrificial layer SL.

Figure 15:
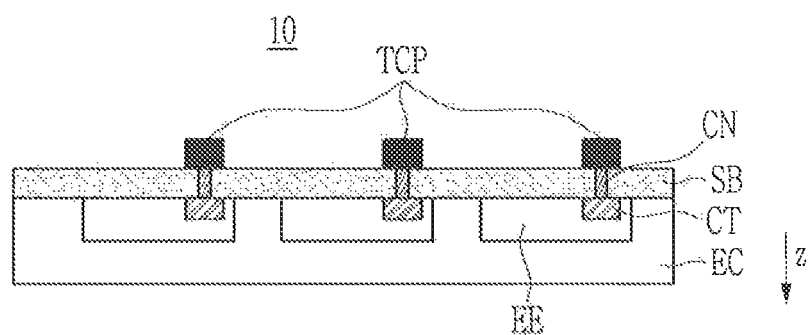

Referring to FIG. 15, the conductor CT disposed on the front surface of the substrate SB and the transferred conductor pattern TCP disposed on the rear surface of the substrate SB are electrically connected by the connector CN formed in the hole penetrating the substrate SB. Thus, a signal and voltage applied to the transferred conductor pattern TCP may be transferred to the electronic element EE located on the substrate SB. In addition, a signal from the electronic element EE may be transmitted to the transferred conductor pattern TCP. The hole and the connector CN of the substrate SB may be formed by a through-silicon via (TSV) method and a through-glass via (TGV) method. The hole and the connector CN of the substrate SB may be perpendicular to a flat surface of the substrate SB. The connector CN may be formed of a conductor such as a metal or a metal alloy. The connector CN may be formed before forming the electronic element EE on the substrate SB or when forming the electronic element EE, or it may be formed after forming the electronic element EE. A portion of the transferred conductor pattern (TCP) other than a portion for forming the pad P described above may be covered with a passivation layer such as an insulating layer for preventing oxidation or the like.

Figure 16:
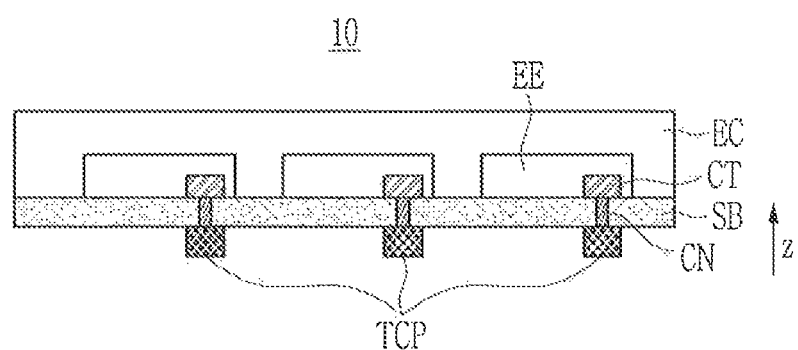
FIG. 16 illustrates a schematic cross-sectional view of a display device according to an exemplary embodiment of the present invention.

FIG. 16 illustrates a schematic cross-sectional view of a display device according to an exemplary embodiment of the present invention.

The display device shown in FIG. 16 differs from the display device shown in FIG. 3 in the transferred conductor pattern TCP. For example, the transferred conductor pattern TCP of FIG. 3 may be made of only a conductive material, but the transferred conductor pattern TCP of FIG. 16 may have the conductive material interfused into the porous pattern of the sacrificial layer SL. Thus, the transferred conductor pattern TCP of FIG. 16 may include both a conductive material and a polymer, and may have a structure in which a conductive material interfuses with the porous polymer. A method of forming the transferred conductor pattern TCP will now be described with reference to FIG. 17 to FIG. 21.

FIG. 17 to FIG. 21 illustrate cross-sectional views of a manufacturing process of the display device shown in FIG. 16.

The step of forming the electronic element EE and the encapsulation layer EC on the substrate SB from the step of stacking the release layer RL on the carrier substrate CS in the display device shown in FIG. 16 are the same as those described with reference to FIG. 4 to FIG. 9.

Figure 17:
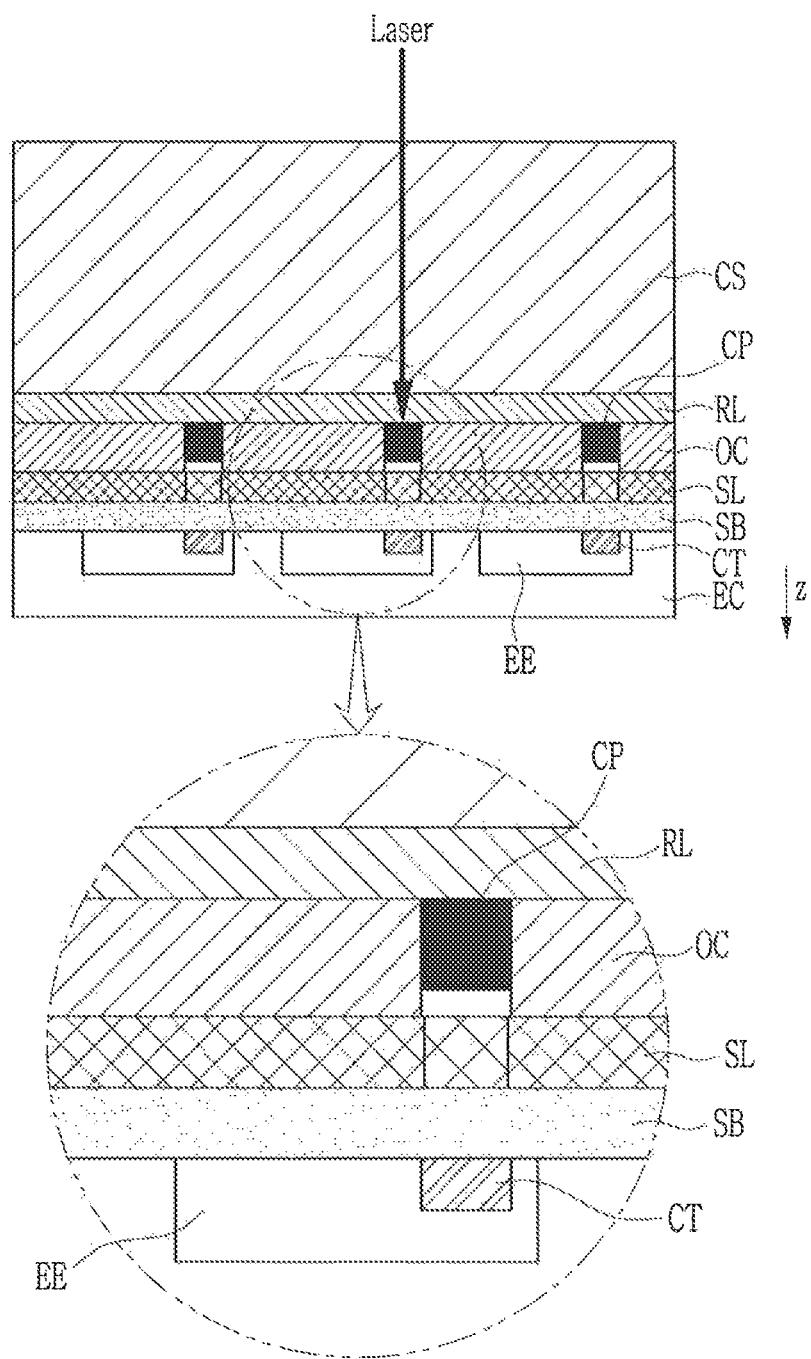
FIGS. 17, 18, 19, 20 and 21 illustrate cross-sectional views of a manufacturing process of the display device shown in FIG. 16.

Then, referring to FIG. 17, a laser is irradiated to the conductor pattern CP from the rear surface of the carrier substrate CS to remove a portion of the overcoat layer OC overlapping the conductor pattern CP, thereby making the portion of the sacrificial layer SL overlapping the conductor pattern CP more porous. The laser may focus on the conductor pattern CP. Unlike the process described with reference to FIG. 10, without completely removing the portion of the sacrificial layer SL overlapping the conductor pattern CP, the laser energy partially vaporizes the portion of the sacrificial layer SL overlapping the conductor pattern CP to increase a volume of the pores, e.g., a size of the pores and/or a number of the pores. Thereby, a porous pattern corresponding to the conductor pattern CP may be formed on the sacrificial layer SL. The porous pattern of the sacrificial layer SL is more porous than another portion of the sacrificial layer SL, thus it may be distinguished from the other portion of the sacrificial layer SL, in other words, a portion of the sacrificial layer SL not overlapping the conductor pattern CP. A process of making the portion of the sacrificial layer SL overlapping the conductor pattern CP more porous without completely removing it may be performed, for example, by appropriately adjusting the material forming the sacrificial layer SL or the laser energy.

Figure 18:
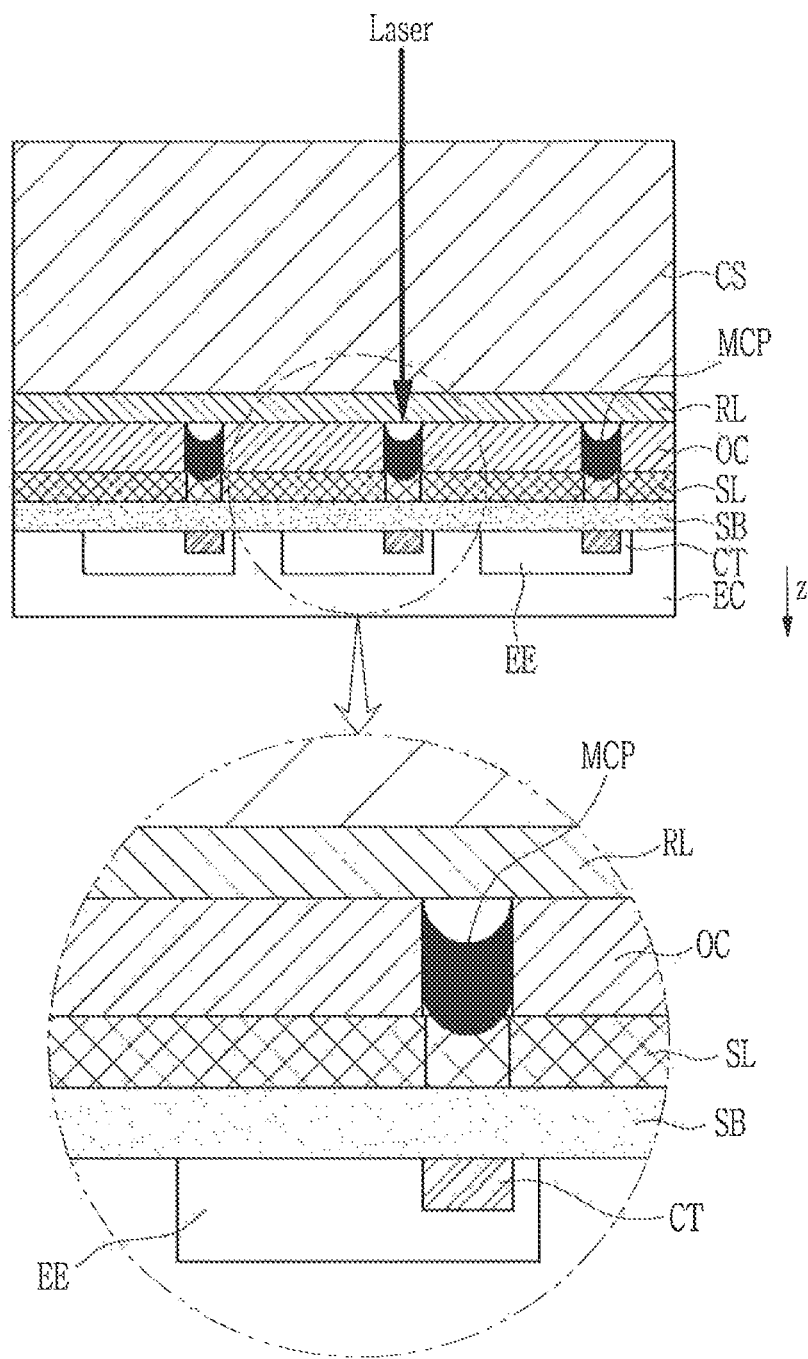
Figure 19:
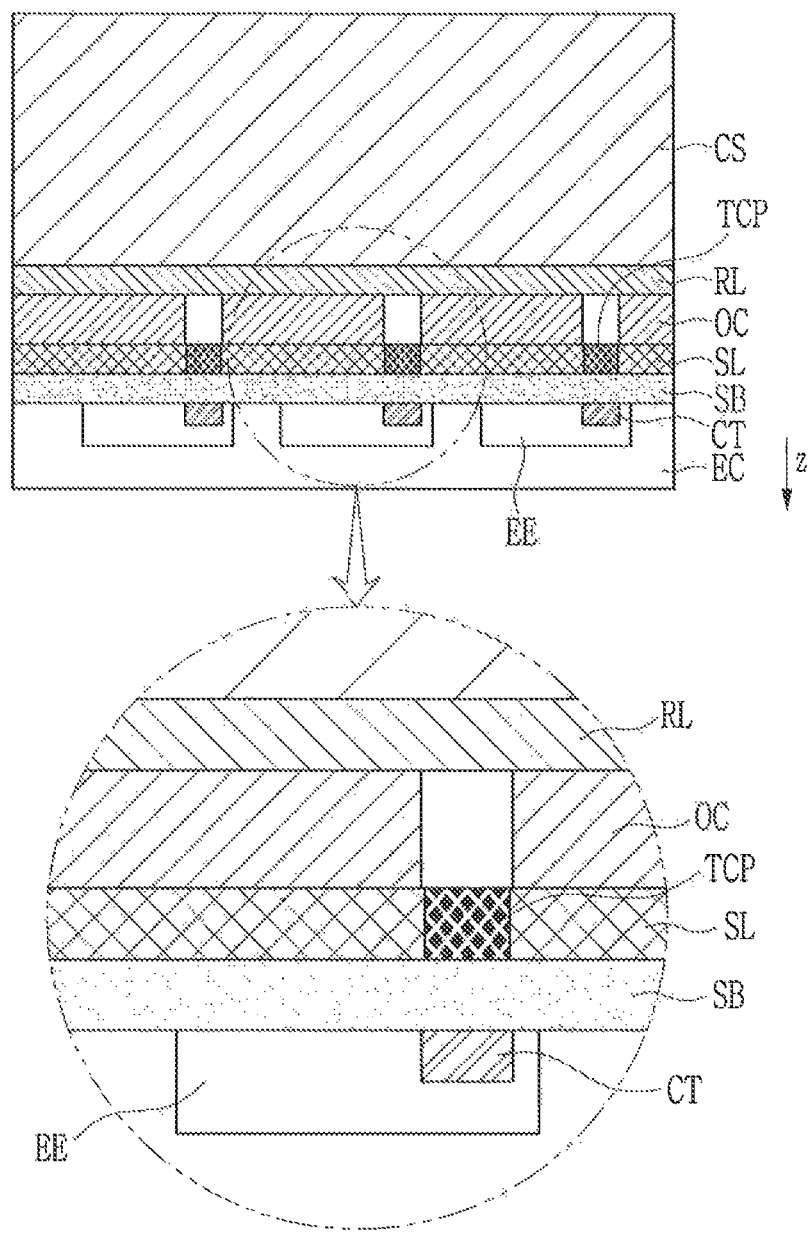

Referring to FIG. 18, a laser is irradiated onto the conductor pattern CP from the rear surface of the carrier substrate CS to interfuse the conductor pattern CP into the porous pattern of the sacrificial layer SL. The laser may be focused on the conductor pattern CP. The conductor pattern CP may be melted by the laser energy, and a blister due to local heating in the area overlapping the conductor pattern CP may generated at the interface between the release layer RL and the carrier substrate CS. When the blister expands due to the laser energy, the release layer RL pushes away the melted conductor pattern MCP, so that the melted conductor pattern MCP may be accurately interfused into the porous pattern of the sacrificial layer SL and then may be solidified on the rear surface of the substrate SB. For example, when the release layer RL pushes the melted conductor pattern MCP away a space may be formed between the release layer RL and the melted conductor pattern MCP. Thus, the conductor pattern CP formed on the release layer RL is transferred to the rear surface of the substrate SB as shown in FIG. 19 to form the transferred conductor pattern TCP. The transferred conductor pattern. TCP has a state in which the conductive material forming the transferred conductor pattern TCP is interfused into the porous pattern of the sacrificial layer SL. Therefore, the pores of the porous pattern of the sacrificial layer SL may be filled with the conductive material of the transferred conductor pattern TCP.

Figure 20:
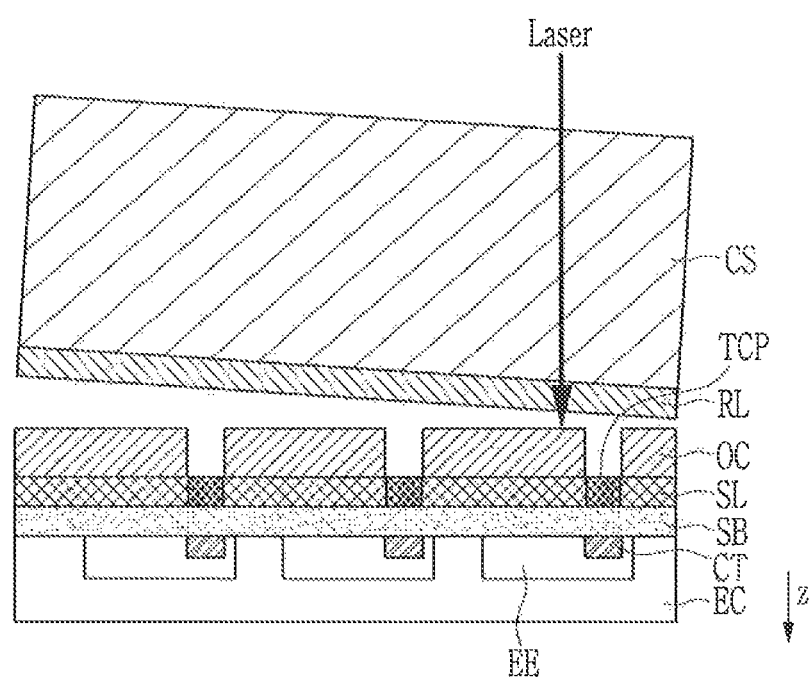
Figure 21:
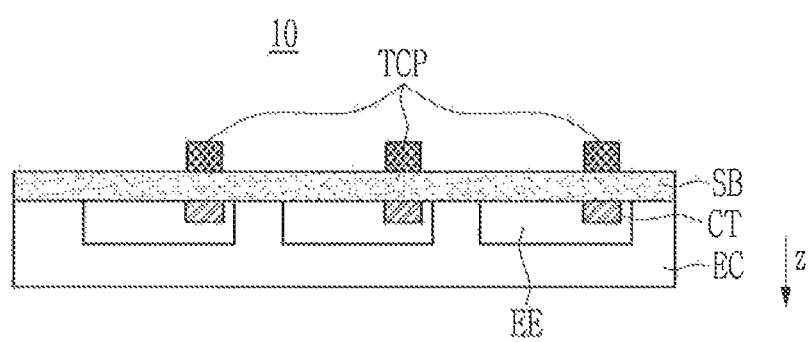

Referring to FIG. 20 and FIG. 21, a laser is irradiated between the release layer RL and the overcoat layer OC to separate the release layer RL from the overcoat layer OC together with the carrier substrate CS. In addition, the overcoat layer OC and the sacrificial layer SL remaining on the rear surface of the substrate SB are simultaneously removed in the same process, or are respectively removed in separate processes. Then, referring to FIG. 16, the hole penetrating through the substrate SB is formed, the connector CN is formed in the hole, and the conductor CT disposed on the front surface of the substrate SB and the transferred conductor pattern TCP disposed on the rear surface of the substrate SB are electrically connected.

The display device and the manufacturing method thereof according to exemplary embodiments of the present invention have been described thus far. Hereinafter, a pixel circuit and a stacked structure with respect to a pixel that may be included in the display device according to the exemplary embodiments of the present invention will be described in detail.

Figure 22:
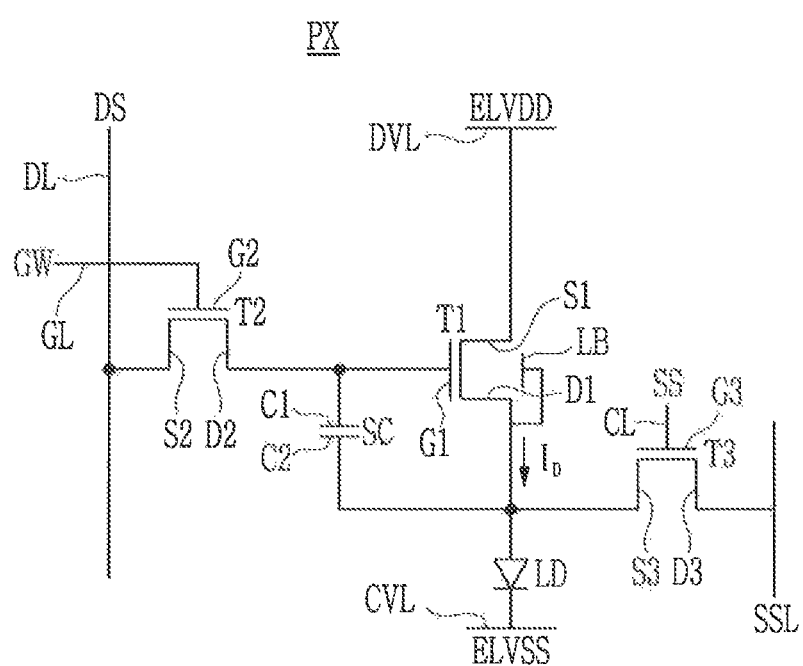
FIG. 22 illustrates an equivalent circuit diagram of one pixel of a display device according to an exemplary embodiment of the present invention.

FIG. 22 illustrates an equivalent circuit diagram of one pixel of a display device according to an exemplary embodiment of the present invention. The pixel circuit shown in FIG. 22 may be a pixel circuit that may be included in display device of FIGS. 1, 3, and 16, and the pixel circuit may be variously changed.

Referring to FIG. 22, the pixel PX includes a plurality of transistors T1, T2, and T3, a storage capacitor SC, and a light emitting element LD. A plurality of signal lines DL, GL, CL, SSL, DVL, and CVL are connected to the pixel PX. Although it is illustrated that the pixel PX is formed with three transistors T1, T2, and T3 and one capacitor SC, the number of transistors and capacitors may be variously changed. Although the structure in which the six signal lines DL, GL, CL, SSL, DVL, and CVL are connected to the pixel PX is shown, a type and number of signal lines may be variously modified.

The signal lines DL, CL, CL, SSL, DVL, and VCL may include a data line DL, a gate line GL, a sensing line SSL, a driving voltage line DVL, and a common voltage line CVL. The gate line GL may transmit a gate signal GW to the second transistor T2. The data line DL may transmit a data signal DS, the driving voltage line DVL may transmit a driving voltage ELVDD, and the common voltage line CVL may transmit a common voltage ELVSS. A sensing control line CL may transmit a sensing signal SS, and the sensing line SSL may be connected to a sensing portion. The transferred conductor pattern TCP described above may include the pad P, the driving voltage line DVL', the common voltage line CVL', and/or the data line DL' electrically connected to the signal tines DL, GL, SSL, DVL, and VCL, which are described above, and the transferred conductor pattern TCP may include at least one of the signal lines CL, CL, SSL, DVL, and VCL.

The transistors T1, T2, and T3 include a first transistor as a driving transistor, a second transistor T2 as a switching transistor, and a third transistor T3 as a sensing transistor. The transistors T1, T2, and T3 are three-terminal elements including gate electrodes G1, G2, and G3, source electrodes S1, S2, and S3, and drain electrodes D1, D2, and D3, respectively. The source electrode and the drain electrode are not fixed, and one of the two terminals excluding the gate electrode of the transistor may be referred to as a source electrode, and the other thereof may be referred to as a drain electrode.

The gate electrode G1 of the first transistor T1 is connected to a first electrode C1 of the storage capacitor SC and the drain electrode D2 of the second transistor T2, the source electrode S1 of the first transistor T1 is connected to the driving voltage line DVL, and the drain electrode D1 of the first transistor T1 is connected to an anode of the light emitting element LD. The first transistor T1 may supply a driving current $I_D$ that varies depending on a magnitude of the data signal DS transmitted through the second transistor T2 to the light emitting element LD, and the light emitting element LD may emit light with a luminance depending on a magnitude of the driving current $I_D$. Therefore, the pixel PX may display a gray level by adjusting an amount of current flowing through the first transistor T1 depending on the magnitude of the data signal DS. The driving current $I_D$ is associated with a gate-source voltage $V_{GS}$ between the gate electrode G1 and the source electrode S1 of the first transistor T1. For example, as the gate-source voltage $V_{GS}$ of the first transistor T1 increases, the driving current $I_D$ may increase. A light blocking layer LB that may overlap the semiconductor layer of the first transistor T1 is connected to the drain electrode D1 of the first transistor T1 to improve characteristics of the first transistor T1 such as its output saturation characteristic.

The gate electrode G2 of the second transistor T2 is connected to the gate line GL, the source electrode S2 of the second transistor T2 is connected to the data line DL, and the drain electrode D2 of the second transistor T2 is connected to the gate electrode G1 of the first transistor T1 and the first electrode C1 of the storage capacitor SC. The second transistor T2 is turned on in response to the gate signal GW transmitted through the gate line GL to supply the data signal DS transmitted through the data line DL to the gate electrode G1 of the first transistor T1 and the first electrode C1 of the storage capacitor SC, which is a switching operation of the second transistor T2.

The gate electrode G3 of the third transistor T3 is connected to the sensing control line CL, the source electrode S3 of the third transistor T3 is connected to the drain electrode D1 of the first transistor T1 and the anode of the light emitting element LD, and the drain electrode D3 of the third transistor T3 is connected to the sensing line SSL. The third transistor T3 is a transistor for sensing a characteristic such as a threshold voltage $V_{th}$ of the first transistor T1 that causes image quality degradation. The third transistor T3 is turned on in response to the sensing signal SS transmitted through the sensing control line CL to electrically connect the first transistor T1 to the sensing line SSL, and the sensing portion coupled to the sensing line SSL may sense characteristic information of the first transistor T1 during a sensing period. A compensated data signal is generated by reflecting the characteristic information sensed by the third transistor T3 during the sensing period, so that a characteristic deviation of the first transistor T1, which may be different for each pixel PX, may be externally compensated.

The first electrode C1 of the storage capacitor SC is connected to the gate electrode G1 of the first transistor T1 and the drain electrode D2 of the second transistor T2, and a second electrode C2 of the storage capacitor SC is connected to the drain electrode D1 of the first transistor T1 and the anode of the light emitting element LD. The storage capacitor SC may continuously apply the charged data signal DS to the first transistor T1 to continuously operate the light emitting element LD to emit light during a light emitting period. A cathode of the light emitting element LD may be connected to the common voltage line CVL for transmitting the common voltage ELVSS.

The transferred conductor pattern TCP may include a portion electrically connected to at least one electrode of the transistors T1, T2, and T3 and the storage capacitor SC.

A configuration of the display panel 10 that may be included in the display device according to the exemplary embodiments of the present invention will be described with reference to FIG. 23.

Figure 23:
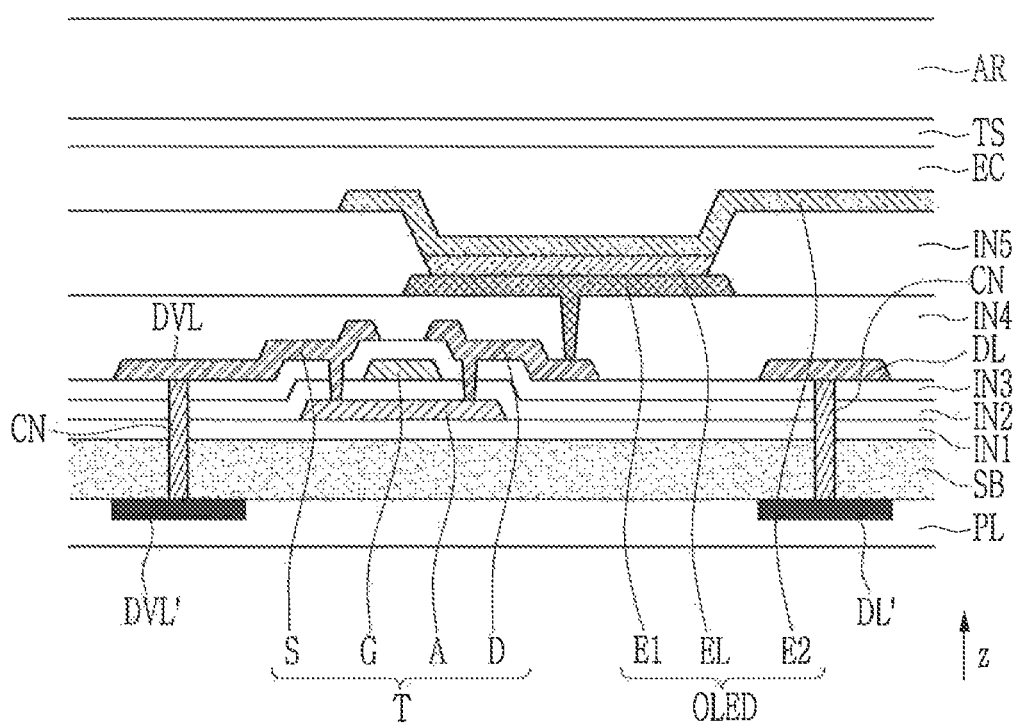
FIG. 23 illustrates a cross-sectional view of a display area of a display device according to an exemplary embodiment of the present invention.

FIG. 23 illustrates a cross-sectional view of a stacked structure of the display panel 10 according to an exemplary embodiment of the present invention. The cross-section shown in FIG. 23 may correspond to approximately one pixel area, for example, a cross-section taken along the line A-A' of FIG. 1.

The display panel 10 includes the substrate SB, a transistor T formed on the substrate SB, and an organic light emitting diode OLED connected to the transistor T. The transistor T may be the driving transistor T1 shown in FIG. 22.

The substrate SB may be a flexible substrate formed of a polymer such as a polyimide (PI), a polyamide (PA), polyethylene terephthalate (PET), and the like. The substrate SB may include a barrier layer for preventing moisture, oxygen, etc. from permeating from the outside. For example, the substrate SB may include at least one polymer layer and at least one barrier layer, and the polymer layer and the barrier layer may be alternately stacked.

A first insulating layer IN1 is disposed on the substrate SB. The first insulating layer IN1 may be a buffer layer, and it may block impurities diffused from the substrate SB to a semiconductor layer A in a process of forming the semiconductor layer A and to reduce a stress applied to the substrate SB. The barrier layer and the first insulating layer IN1 may include an inorganic insulating material such as a silicon oxide or a silicon nitride.

The semiconductor layer A of the transistor T is disposed on the first insulating layer IN1, and a second insulating layer IN2 is disposed on the semiconductor layer A. The semiconductor layer A) includes a source region, a drain region, and a channel region therebetween. The semiconductor layer A may include a semiconductor material such as polycrystalline silicon, an oxide semiconductor, and amorphous silicon. The second insulating layer IN2 may be a gate insulating layer, and may include an inorganic insulating material.

A gate conductor including a gate electrode G and a gate line of the transistor T is disposed on the second insulating layer IN2. The gale conductor may include a metal such as molybdenum (Mo), copper (Cu), aluminum (Al), silver (Ag), chromium (Cr), tantalum (Ta), and titanium (Ti), or a metal alloy thereof.

A third insulating layer IN3 is disposed on the gate conductor. The third insulating layer IN3 may be an interlayer insulating layer, and may include an inorganic insulating material.

A data conductor including a source electrode S and a drain electrode D of the transistor TR, a driving voltage line DVL, and a data line DL is located on the third insulating layer IN3. The source electrode S and the drain electrode D are connected to the source region and the drain region of the semiconductor layer A through contact holes formed in the third insulating layer IN3 and the second insulating layer IN2, respectively. The data conductor may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), and the like, or a metal alloy thereof.

A fourth insulating layer IN4 is disposed on the data conductor. The fourth insulating layer IN4 may be a planarization layer or a passivation layer, and may include an organic insulating material.

A first electrode E1 is disposed on the fourth insulating layer IN4. The first electrode E1 may be a pixel electrode. The first electrode E1 may be connected to the drain electrode D through a contact hole formed in the fourth insulating layer IN4 to receive a data signal for controlling the brightness of the organic light emitting diode OLED.

A fifth insulating layer IN5 is disposed on the fourth insulating layer IN4. The fifth insulating layer IN5 may be a pixel defining layer, and may be provided with an opening overlapping the first electrode E1. In the opening of the fifth insulating layer IN5, a light emitting layer EL is disposed on the first electrode E1 and a second electrode E2 is disposed on the light emitting layer EL. The second electrode E2 may be a common electrode CE.

The first electrode E1, the light emitting layer EL, and the second electrode E2 form a light emitting element, for example, the organic light emitting diode OLED. The first electrode E1 may be an anode of the organic light emitting diode and the second electrode E2 may be a cathode of the organic light emitting diode OLED.

An encapsulation layer EC is disposed on the second electrode E2. The encapsulation layer EC may encapsulate the organic light emitting diode OLED to prevent moisture or oxygen from permeating from the outside. The encapsulation layer EC may include at least one inorganic material layer and at least one organic material layer, and the inorganic material layer and the organic material layer may be alternately stacked.

A touch sensor layer TS may be disposed on the encapsulation layer EC. The touch sensor layer TS may include touch electrodes formed of a transparent conductive material such as ITO or IZO, a metal mesh, or the like, and the touch electrodes may be formed as a single layer or a multilayer. The touch sensor layer TS may be directly formed on the encapsulation layer EC, or separately formed to be attached to the encapsulation layer EC.

An anti-reflection layer AR for reducing external light reflection may be disposed on the touch sensor layer TS. The anti-reflection layer AR may include a polarizing layer. An anti-reflection effect may be obtained by forming the encapsulation layer EC and/or the touch sensor layer TS in a refractive index matching structure without separately forming the anti-reflection layer AR.

A transferred conductor pattern including a power source voltage line such as a driving voltage line DVL', a data line DL', and the like is disposed below the substrate SB. The driving voltage line DVL' and the data line DL' are electrically connected to the driving voltage line DVL and the data line DL disposed on the substrate SB by the connector CN formed in the substrate SB and the first, second and third insulating layers IN1, IN2, and IN3, respectively.

A passivation layer PL covering the transferred conductor pattern may be disposed under the transferred conductor pattern. A passivation film, which may be formed of PET or the like, for protecting the display panel 10, may be positioned under the passivation layer PL, and a functional sheet such as a cushion layer, a heat radiation sheet, a light blocking sheet, and a waterproof tape may be disposed under the passivation film.

It has been described that the display panel 10 is an organic light emitting display panel, but the display panel 10 may be a display panel including a light emitting diode (LED), a display panel including a liquid crystal layer, and the like.

Figure 24:
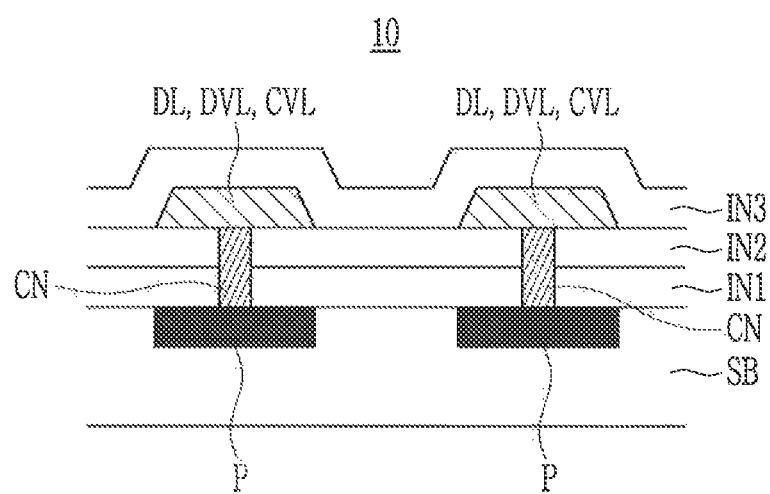
FIG. 24 illustrates a cross-sectional view of a pad area of a display device according to an exemplary embodiment of the present invention.

FIG. 24 illustrates a cross-sectional view of a pad area of a display device according to an exemplary embodiment of the present invention. FIG. 24 may correspond to a cross-section taken along the line B-B' of FIG. 1.

Referring to FIG. 24, the display panel 10 includes a pad portion PP in which pads P disposed on the rear surface of the substrate SB are arranged. The pads P may be the transferred conductor pattern TCP, which is described above, or a portion of the transferred conductor pattern TCP. The pads P may be electrically connected to the conductor such as the data line DL, the driving voltage line DVL, and the common voltage line CVL disposed on the substrate SB by the connector CN formed through the substrate SB, the first insulating layer IL1, and the second insulating layer IL2.

Unlike as shown in FIG. 23, the conductor such as the data line DL, the driving voltage line DVL, and the common voltage line CVL connected to the pads P may be disposed between the second insulation layer IL2 and the third insulation layer IL3. The conductor on the substrate SB electrically connected to the transferred conductor pattern TCP through the connector CN may be variously disposed between the substrate SB and the first insulating layer IL1, between the first insulating layer IL1 and the second insulating layer IL2, between the second insulating layer IL2 and the third insulating layer IL3, and on the third insulating layer IL3.

As such, by forming the pad portion PP on the rear surface of the substrate SB, the non-display area NA of the display panel 10 may be reduced, and a degree of freedom in designing the pad portion PP may be increased. The pad portion PP may overlap the non-display area NA of the display panel 10, may overlap the display area DA, or may overlap both the display area DA and the non-display area NA.

Exemplary embodiments of the present invention provide a display device and a manufacturing method thereof that improve a screen-to-body ratio and reliability.

For example, according to the embodiments of the present invention, it is possible to reduce the non-display area of the display device to increase the screen to body ratio and improve the degree of freedom in designing a conductor pattern such as a pad portion and the resistance characteristic of signal lines.

While this invention has been particularly shown and described with reference to exemplary embodiments thereof, it is to be understood by those skilled in the art that various modifications may be made thereto without departing from the spirit and scope of the present invention as set forth in the appended claims.

What is claimed is:

1. A manufacturing method of a display device, comprising:
   stacking a release layer over a first substrate;
   forming a conductor pattern over the release layer;
   forming a sacrificial layer over the conductor pattern;
   forming a second substrate including a polymer layer over the sacrificial layer;
   forming an electronic element including a conductor over the second substrate;
   forming a pattern corresponding to the conductor pattern in the sacrificial layer;
   transferring the conductor pattern from the release layer to a surface of the second substrate; and
   removing the first substrate, the release layer, and the sacrificial layer.

2. The manufacturing method of the display device of claim 1, wherein the release layer is a dynamic release layer.

3. The manufacturing method of the display device of claim 1, wherein the pattern in the sacrificial layer is an engraved pattern, and the forming of the pattern in the sacrificial layer includes irradiating the conductor pattern with a laser to remove a portion of the sacrificial layer overlapping the conductor pattern.

4. The manufacturing method of the display device of claim 3, wherein the removing of the portion of the sacrificial layer overlapping the conductor pattern includes vaporizing the portion of the sacrificial layer overlapping the conductor pattern.

5. The manufacturing method of the display device of claim 1, wherein the transferring of the conductor pattern to the surface of the second substrate includes irradiating the conductor pattern with a laser to melt the conductor pattern, and interfusing the melted conductor pattern into the pattern in the sacrificial layer.

6. The manufacturing method of the display device of claim 1, further comprising forming an overcoat layer covering the conductor pattern after forming the conductor pattern and before forming the sacrificial layer.

7. The manufacturing method of the display device of claim 1, further comprising electrically connecting the conductor pattern and the conductor.

8. The manufacturing method of the display device of claim 1, wherein the removing of the first substrate, the release layer, and the sacrificial layer includes removing the sacrificial layer after simultaneously separating the first substrate and the release layer from the sacrificial layer.

9. The manufacturing method of the display device of claim 1, wherein the electronic element further includes a transistor and a light emitting; element.

10. The manufacturing method of the display device of claim 1, wherein the conductor includes a power supply line or a data line.

11. The manufacturing method of the display device of claim 1, wherein the conductor pattern includes a pad, a power supply line, or a data line.

12. The manufacturing method of the display device of claim 1, wherein the sacrificial layer includes a porous polymer.

13. The manufacturing method of the display device of claim 12, wherein the pattern in the sacrificial layer is a porous pattern, and the forming of the pattern in the sacrificial layer includes irradiating the conductor pattern with a laser to increase porosity of a portion of the sacrificial layer corresponding to the conductor pattern.

14. The manufacturing method of the display device of claim 1, wherein transferring the conductor pattern from the release layer to the surface of the second substrate includes interfusing the conductor pattern to the pane in the sacrificial layer.

15. The manufacturing method of the display device of claim 1, wherein the surface of the second substrate to which the conductor pattern is transferred is a rear surface of the second substrate.

16. A method of manufacturing a display device, comprising:
   stacking a release layer over a first substrate;
   forming a conductor pattern over the release layer,
   forming a sacrificial layer over the conductor pattern;
   forming a second substrate over the sacrificial layer;
   forming a conductor over the second substrate,
   irradiating a laser to the conductor pattern to remove a portion of the sacrificial layer overlapping the conductor pattern and transfer the conductor pattern to the second substrate in a space formed in the sacrificial layer; and
   removing the first substrate, the release layer and the sacrificial layer.

17. The method of claim 16, wherein the sacrificial layer includes a porous polymer.

18. The method of claim 16, wherein the laser is irradiated from a first surface of the first substrate to the conductor pattern which is disposed at a second surface of the first substrate opposite the first surface.

* * * * *